(12) United States Patent
Gorczyca et al.

(10) Patent No.: US 6,368,410 B1
(45) Date of Patent: Apr. 9, 2002

(54) SEMICONDUCTOR PROCESSING ARTICLE

(75) Inventors: Thomas Bert Gorczyca, Schenectady, NY (US); Udo Heinz Retzlaff, Schwarzenbek; Stephan Popp, Hamburg, both of (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/340,793

(22) Filed: Jun. 28, 1999

(51) Int. Cl.$^7$ .............................................. C23C 16/00
(52) U.S. Cl. ....................................... 118/715; 118/500
(58) Field of Search ........................... 118/715–733, 500

(56) References Cited

U.S. PATENT DOCUMENTS

| | | | |
|---|---|---|---|
| 3,805,453 A | 4/1974 | Schmall ............................ 51/8 |
| 3,951,587 A | 4/1976 | Alliegro et al. ............... 432/253 |
| 4,576,698 A | 3/1986 | Gallagher et al. ...... 204/192 E |
| 4,761,134 A | 8/1988 | Foster ........................... 432/253 |
| 4,998,879 A | 3/1991 | Foster et al. ................. 432/253 |
| 5,149,378 A | * 9/1992 | Ohmi et al. .................. 118/725 |
| 5,202,008 A | 4/1993 | Talieh et al. ............ 204/192.32 |
| 5,345,999 A | * 9/1994 | Hosokawa .................. 165/80.2 |
| 5,401,319 A | 3/1995 | Banholzer et al. ............... 134/1 |
| 5,460,684 A | * 10/1995 | Saeki et al. .................. 156/345 |
| 5,565,068 A | 10/1996 | Banholzer et al. ........... 156/345 |
| 5,762,748 A | 6/1998 | Banholzer et al. ........... 156/345 |
| 5,851,307 A | 12/1998 | Gilber et al. ............... 134/22.1 |
| 5,952,063 A | * 9/1999 | Kimura et al. .............. 428/34.1 |
| 6,074,488 A | * 6/2000 | Roderick et al. ............ 118/728 |
| 6,095,083 A | * 8/2000 | Rice et al. ................. 118/723 I |
| 6,110,285 A | * 8/2000 | Kitazawa et al. ............ 118/715 |
| 6,120,640 A | * 9/2000 | Shih et al. ................... 156/345 |
| 6,150,006 A | * 9/2000 | Hellmann et al. ........... 428/141 |
| 6,165,274 A | * 12/2000 | Akiyama et al. ............ 118/724 |
| 6,187,103 B1 | * 2/2001 | Huang et al. ................ 118/728 |

FOREIGN PATENT DOCUMENTS

DE              3942931 A1   *   6/1990

* cited by examiner

Primary Examiner—Jeffrie R. Lund
(74) Attorney, Agent, or Firm—Toan P. Vo; Noreen C. Johnson

(57) ABSTRACT

A semiconductor processing article is characterized by extended useful life. The article is used in a semiconductor furnace system, particularly in a low pressure chemical vapor deposition furnace for prolonged periods without requiring cleaning to remove build-up film. The semiconductor processing article is a quartz body characterized by a surface roughness having a first component with an average deviation from a first mean surface of about 2.5 to 50 microns, and a second component with an average deviation from a second mean surface of about 0.25 to 5 microns. The processing article is prepared for use in the furnace by mechanically blasting and chemically etching the surface of the article.

14 Claims, 3 Drawing Sheets

SEMICONDUCTOR PROCESSING ARTICLE

BACKGROUND OF THE INVENTION

The present invention relates to a semiconductor processing article and to a system to process semiconductors in a low pressure chemical vapor deposition furnace.

Low pressure chemical vapor deposition (LPCVD) is a film forming process for the production of semiconductor devices. The process is used in the formation of layers such as silicon nitride, silicon dioxide and polysilicon on a silicon wafer substrate. Low pressure techniques, for example in the range of 0.5–3 torr have advantages in terms of uniformity in processing. Typically in the process, a substrate is placed in a reaction chamber, which is heated and brought to a low pressure state. A reaction gas is introduced into the chamber, and reaction material is deposited on the substrate either by reaction or by thermal decomposition of the reaction gas.

The deposition is typically conducted at temperatures between 550° C. and 950° C., at a pressure of about 1 torr using processing articles that include, for example, a liner, process tube, shield, baffle, paddle, cantilever arm, carrier or boat made out of fused quartz. Since the processing articles are at the same temperature as the wafer substrate, the articles are coated at every run with a layer as thick as the layer deposited on the substrate. After many runs, each article is covered with a thick film build-up. The film build-up causes a stress from the coefficient of thermal expansion (CTE) difference between silicon (2.9 ppm/° C.) or silicon nitride (5.0 ppm/° C.) and quartz (0.5 ppm/° C.). Eventually, this stress induces cracking in the surface of the quartz. Articles such as wafer carriers or boats and related cantilever arms are more prone to crack formation because they are cycled from the process chamber temperature to room temperature with each run to allow loading and unloading of wafers. Additionally, film buildup results in flakes that contaminate the semiconductor products and cause defects in the layers being formed. Unless the film deposited on each article is frequently removed, it will contaminate the substrate during processing, significantly degrading device yield.

The processing articles can be cleaned to remove film build-up. Typically, the articles are cleaned after a build-up of a film 5–10 microns thick. Cleaning the articles is time consuming and requires shut down of the LPCVD processing equipment. Also, frequent cleaning can lengthen micro cracks in the quartz. Micro cracks promote brittleness and contribute to part failure. There is a need to eliminate the adverse effects of film build-up on LPCVD furnace processing articles without increased cleaning.

SUMMARY OF THE INVENTION

The invention relates to a semiconductor processing article that is characterized by extended useful life. The article can be used in a semiconductor furnace system, particularly in a LPCVD furnace for prolonged periods without requiring cleaning to remove build-up film. The semiconductor processing article typically comprises a quartz body characterized by a surface roughness having a first component with an average deviation from a first mean surface of about 2.5 to 50 microns, and a second component with an average deviation from a second mean surface of about 0.25 to 5 microns. The processing article is prepared for use in the furnace by mechanically roughening and chemically roughening the quartz surface of the article.

In another aspect, the invention relates to a heat treatment process, comprising preparing a quartz processing article by mechanically blasting and chemically etching the surface of the article. The article is then installed into a processing chamber of a chemical vapor deposition furnace. A substrate to be treated is loaded into the processing chamber and a treatment gas is supplied into the processing chamber to form a film on the substrate.

DETAILED DESCRIPTION OF THE INVENTION

According to an exemplary embodiment of the present invention, the quartz surface of a processing article is treated to render the surface less prone to surface cracking and spalling and to allow for extended use of the article in an LPCVD system before particles are formed indicating cleaning is necessary. According to an exemplary embodiment of the invention, the quartz surface is roughened by both mechanical and chemical means. The mechanical step provides topography extending over large distances on the quartz. The chemical step imposes a much finer surface topography on the quartz superimposed over the mechanically roughened portion.

These and other features will become apparent from the following drawings and detailed discussion, which by way of example without limitation describe embodiments of the present invention.

Figure 1:
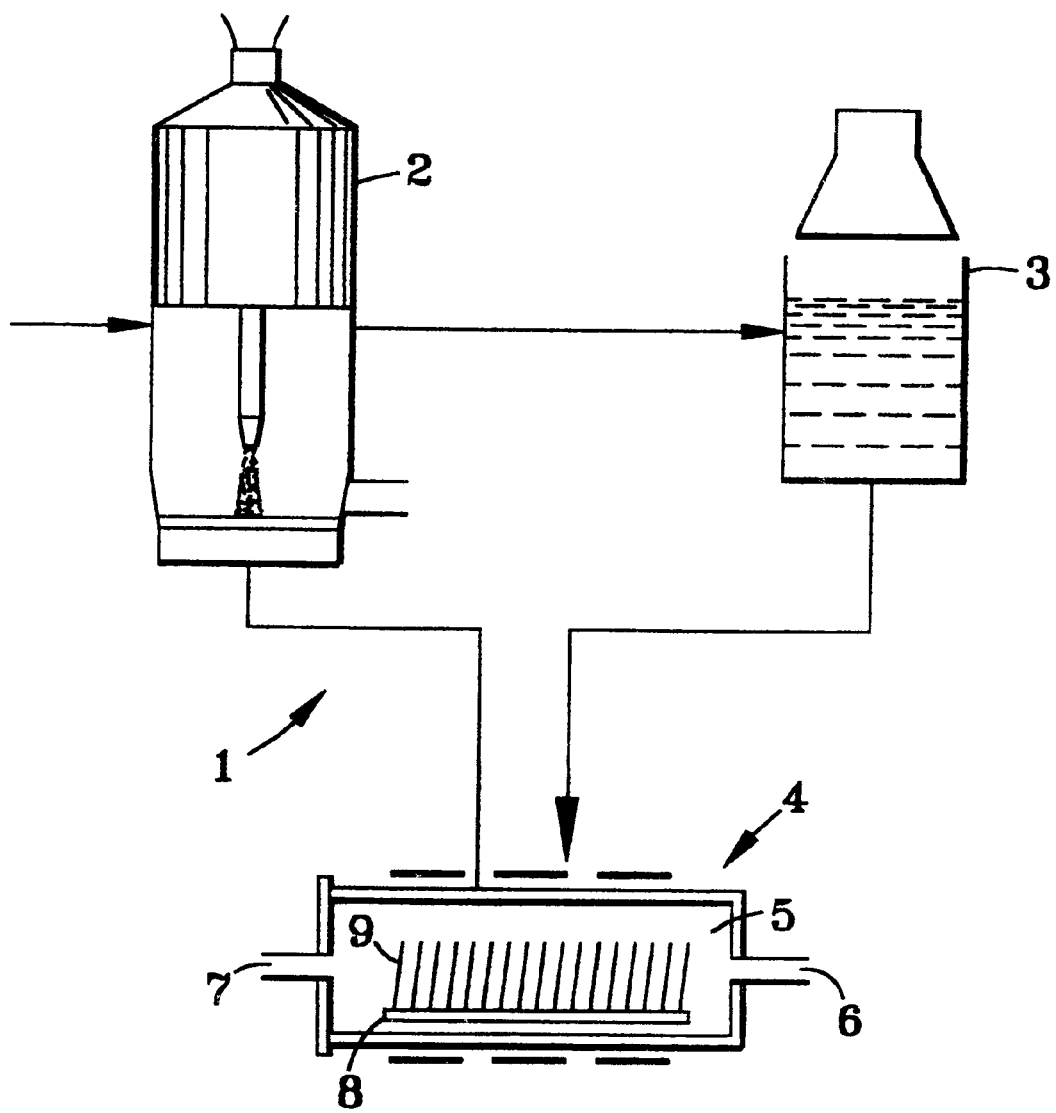
FIG. 1 is a schematic representation partially cut-away, of an exemplary processing system and method for producing semiconductor wafers.

FIG. 1 is a schematic representation of a processing system and method of preparing a quartz processing article for use with or in an LPCVD furnace for applying a film to produce a semiconductor wafer. FIG. 1 shows system 1, which includes a sand blasting apparatus 2, a chemical etch apparatus 3 and an LPCVD deposition furnace 4. The sand blasting apparatus 2, chemical etch apparatus 3, and chemical vapor deposition furnace 4 are represented by icons. The icons represent any apparatus that can be included in the system. The icons are intended to broadly represent the invention and are not intended to represent specific apparatus or processing steps.

The LPCVD deposition furnace 4 includes a processing chamber 5 to maintain a reduced pressure having at least one gas inlet 6 to provide a reactive gas mixture therein and at least one exhaust outlet 7. A support 8 comprises a quartz processing article such as a boat that has been prepared according to an embodiment of the present invention. The support 8 is positioned within the chamber 5, and a substrate 9 to be treated is shown positioned on the support 8.

The support 8 is processed by mechanically roughening a surface of the article at 2 and chemically roughening the surface at 3. FIG. 1 represents both a process of initially treating quartz articles prior to installation within or use with an LPCVD furnace and to a cleaning and treating of quartz articles for reinstallation in or reuse with an LPCVD furnace as hereinafter described.

The first mechanically roughening step can include mechanically blasting the surface of the processing article. This step can be carried out by blast abrading, a process in which an abrasive is directed at high velocity against a surface being cleaned. For example, sand blasting cleans an object by blast abrading in which steel grit, sand, or other abrasive is blown against the object to produce a roughened surface. The abrasive is propelled by a fluid against the solid surface of the article to provide a first textured surface.

Preferably, the quartz article is roughened by sand blasting using silicon carbide, alumina or silica grit or other suitable abrasive material with size ranges between about 1 and about and 800 microns, desirably between about 5 and about 400 microns and preferably between about 50 and about 150 microns. Standard sand blasting equipment comprises a pressure vessel or blasting pot to hold particles of abrasive connected to a source of compressed air by means of a hose. The vessel has a means of metering the abrasive from the blast pot, which operates at a pressure that is the same or slightly higher than the conveying hose pressure. The sand/compressed air mixture is transported to a nozzle where the sand particles are accelerated and directed toward the processing article.

The parameters for controlling the sand blasting process include the grit type, the pressure applied to the grit media, the distance between the sand jet nozzle and the article to be blasted, and the angle used for directing the grit to the article surface. According to exemplary embodiments of the invention, the roughening air pressure can be controlled between about 10 and about 500 psi, desirably between about 10 and about 250 psi and preferably between about 15 and about 150 psi. The spray nozzle can be directed with an angle of incidence to the article surface between about 1 and about 90 degrees, desirably between about 30 and about 90 degrees and preferably between about 45 and about 90 degrees, at a distance between about 0.1 and about 300 cm, desirably between about 1 and about 100 cm and preferably between about 5 and about 20 cm. The time of contact for the mechanical roughening with grit onto a specific area of an article being roughened can vary between more than 0 to 500 seconds, desirably between 1 to 30 seconds and preferably between 2 to 10 seconds.

Flow rate s of the sand or other blast media are determined by the size of the equipment. Sand blasting apparatus typically employ media flow rates of 20–30 lbs/min. About 1.2 lbs of sand are typically used with about 1.0 lb of air, thus yielding a ratio of 1.20.

The sand blasting step can be controlled within the parameters of conditions and selected grit to provide both smooth and roughened areas of quartz surface over distances of 1 to 2 mm. For example, the surface can be quickly abraded to a desired surface specification by using a combination of higher air pressure such as 150 psi, an incidence angle near 90 degrees and a close nozzle to article distance such as 1 cm. Lower pressure such as 15 psi, an angle of incidence of 30 degrees, and a nozzle to article distance of 10 cm abrades the surface more slowly and will provide a surface with both roughened portions and smooth, non abraded portions. Also, less hard grit such as silica grit (hardness equals approximately 6 Mohs) instead of a harder grit such as silicon carbide (hardness equals approximately 9.2 Mohs) results in a lower rate of surface abrasion.

Figure 4:
FIG. 4 is a cross section microphotograph of a sand blasted quartz sample.
Figure 5:
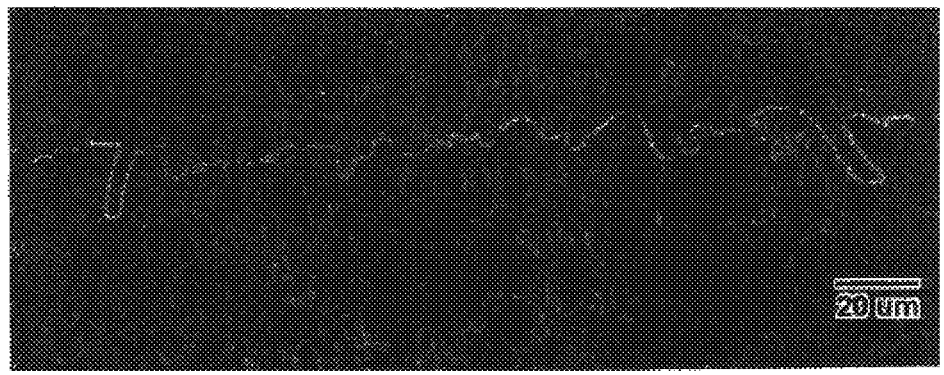
FIG. 5 is a cross section microphotograph of the sand blasted sample of FIG. 4 after HF chemically etching.

In a next step, the article is subjected to a chemical roughening step in apparatus 3. In this step, micro cracks in the quartz that occurred during the mechanical roughening step are reduced or eliminated. In this step, chemical etching is used to open up or round out the micro cracks, leaving a surface with trenches that replace the cracks. FIG. 4 shows cracks caused by mechanically roughening which appear as breaks in the quartz glassy structure propagating from the treated surface into the quartz for distances up to 200 micrometers. The width of the cracks typically is less than or equal to 1 micrometer. As shown in FIG. 5, trenches are left when the cracks are subjected to chemical etching. The etchant enters the crack, and typically it isotropically etches in all directions, widening the crack and rounding out its tip to terminate further crack propagation. The shape of the trench prevents further propagation into the quartz bulk when surface stress is applied during the LPCVD coating step. The width of the trench after chemical etching depends on the amount of time the crack is exposed to etchant and the rate at which the etchant dissolves quartz. For example, a water solution containing 10% hydrofluoric acid applied for 30 minutes removes about 3 microns of quartz and forms trenches approximately 6 microns wide.

According to one embodiment of the invention, the trenches can be partially filled by applying a silicon film. The silicon can be converted to silicon oxide, which expands in volume to completely fill the trench.

The etching can be accomplished by any conventional etching technique such as exposing the processing article to etching acids or subjecting the article to a plasma etching. For example, the processing article can be placed in a suitable plasma etching machine such an IPC series 4000, manufactured by International Plasma Corporation. The processing article is placed in the work chamber of the plasma etching machine and the chamber is then evacuated. The processing article is preheated in the chamber in a nitrogen plasma formed at an RF power from about 100 watts to about 200 watts of energy and from 0.5 torr to 0.6 torr pressure for a period of about 3 minutes to bring the temperature of the processing article to about 75° C. This preheating step is practiced to bring the processing article up to the reaction temperature required for etching in a uniform manner. The desired reaction temperature typically ranges from 65° C. to 85° C.

After preheating the processing article, $CF_4$ including 4% oxygen by volume at a gas flow rate of from about 100 cc/minute to about 150 cc/minute, is introduced, and a plasma is formed at an energy level of about 100 watts. Pressure in the chamber is typically about 0.3 to 0.5 torr. The plasma typically etches at a rate of from about $0.5 \times 10^3$ angstroms to about $1 \times 10^3$ angstroms per minute. Plasma etching is practiced for a sufficient time to provide a surface roughening or for about one to two minutes.

A new plasma of oxygen is initiated. The RF power is from about 200 watts to about 400 watts. About 300 watts is preferred. The gas flow rate is about 300 cc/minute of oxygen to obtain a chamber pressure of preferably about 1.6 torr. However, the chamber pressure may range from about 0.8 torr to 2.0 torr.

Upon completion of the etching, the plasma is turned off. The chamber is evacuated, and a new plasma is formed of $CF_4$ and oxygen. The processing article is then subjected to the plasma etchant for about one minute. The plasma is turned off, the chamber brought again to atmospheric pressure, and the processing article is removed from the chamber.

Preferably, the etching is conducted by subjecting the mechanically roughened quartz to an etching solution containing hydrofluoric acid with optional components of ammonium fluoride, acetic acid, water and dissolved silica.

The proportions of acids in this etching solution can vary from more than 0 to 70 vol % with the ammonium fluoride varying from 0 to 50 wt % and silica amounting to from 0 to 5 wt %. Desirable solutions consist of 20 to 60 vol % hydrofluoric acid, 10 to 30 wt % ammonium fluoride, 20 to 50 vol % acetic acid and 0 to 2 wt % silica. A preferred etching solution comprises 40 to 50 vol % hydrofluoric acid, 15 to 25 wt % ammonium fluoride, 30 to 40 vol % acetic acid and 0.1 wt % silica. The quartz can be in contact with the preferred etching solution for a period between about 0.1 to 5 hours, desirably between about 0.2 to 2 hours and preferably between 0.5 to 1 hours. The temperature of the etching solution can vary between 10° C. to 40° C. with a preferable temperature range between 15° C. to 25° C.

After treatment, the quartz body is typically characterized by a surface roughness having a first component formed by the mechanical treatment and a second component, superimposed on the first component, formed by the chemical treatment. The first and second components of the surface roughness can be described with reference to a mean surface. The mean surface is typically defined as a line drawn through the surface profile in such a way that the area filled with material equals the unfilled area. A first mean surface can be defined over a sample length along the surface of about 500 microns, for example, to characterize the surface deviation formed by the mechanical treatment. A second mean surface can defined over a sample length along the surface of about 50 microns, for example, to characterize the surface deviation formed by the chemical treatment.

According to exemplary embodiments of the invention, the surface roughness has a first component with peaks having a deviation from the first mean surface of about ±5 to ±100 microns, more typically about ±10 to ±50 microns, and a second component with peaks having a deviation from the second mean surface of about ±0.5 to ±10 microns, more typically about ±1 to ±5 microns.

The average deviation of the first component of the surface roughness from the first mean surface is typically between about 2.5 and 50 microns, more typically between about 5 and 25 microns. The average deviation of the second component from the second mean surface is typically between about 0.25 and 5 microns, more typically between about 0.5 and 2.5 microns. Average deviation $R_a$ can be determined with the following integral:

$$R_a = \frac{1}{l} \int_0^l |y| dl$$

where y is the height from the mean surface at a given point, and l is the sample length.

The process, according to exemplary embodiments of the invention, can include other steps to remove loosely adhering pieces on the quartz surface. For example, the surface can be ultrasonically cleaned or washed with distilled water and rinsed. Additionally, the surface can be cleaned by the application of a high pressure spray of water. This step comprises spraying a high pressure water jet at the surface of the article to remove loosely adhering quartz pieces. Removal of adhering quartz pieces by this step reduces the possibility of introducing particles into the deposition chamber. Typically, water pressure, size and shape of the spray jet, distance of the spray jet from the quartz surface, and the amount of time it impinges on the surface can be controlled, as is well known in the art, to remove all adhering pieces. For example, in one procedure, water was pressurized to 500 psi and sent through a fan type nozzle. This provides a water spray that expands from the nozzle at about a 45 degree angle. The nozzle was held at a distance of 3 cm from the surface of the article for about 2 seconds. Water pressures between 10 to 2000 psi can be used to provide a spray that exits the nozzle and expands to an angle between about 1 to about 90 degrees.

The process can be used for pretreating an article. Pretreating herein means preparing an article that has not previously been utilized in or as part of an LPCVD furnace. In this aspect of the invention, pretreating assures that deposited silicon film will firmly adhere to the quartz article. The film does not flake or delaminate from the quartz substrate as readily as flakes and delaminations begin to occur with a non-pretreated roughened article.

Further in accordance with exemplary embodiments of the invention, an article that has been used with or as part of a LPCVD furnace can be prepared for further use with or as part of the furnace by an exemplary process of the invention. The article can be treated when flaking and delaminating film indicate that the article should be cleaned. The furnace can be dismantled and both articles used in connection with the furnace and articles used as part of the structure of the furnace can be prepared together for further use.

In another embodiment, the invention comprises mechanically roughening and chemically roughening a surface of an article that is cycled into and out of the LPCVD furnace in processing cycles. Such articles include boats, vessels, and cantilever arms, which are subjected to temperature change cycles with every cycle into and out of the furnace. As a result, these articles are much more readily affected by the stress of silicon film build up. They require substantially more frequent cleaning than articles that are part of the furnace. Consequently, the present invention can be advantageous when used to prepare articles that are cycled into and out of the furnace. In one aspect of this embodiment, the cantilever arm, carrier or boat that is used in connection with the furnace can be separately prepared for further use while the articles within the furnace can be separately cleaned in situ when cleaning is required. In another aspect, the furnace can be disassembled and all articles prepared together for further use.

EXAMPLES

Figure 2:
FIG. 2 is a microphotograph of a quartz sample after sand blasting.

An initially smooth, fire polished quartz test piece was sandblasted using 120 micron sized silicon carbide grit at 60 psi at a nozzle distance of 7 cm for a period of 5 seconds. The surface roughness of the quartz article after treatment was measured by profilometery. The roughness was measured to be ±15 microns over a distance of 1000 microns. FIG. 2 is an electron microscope image of the sand blasted surface. After mechanical treatment, the article was subjected to a chemical etch consisting of 95 g (49% hydrofluoric acid solution), 35 g ammonium fluoride, and 71 g glacial acetic acid for 1 hour at 15° C. This treatment selectively etched approximately 6 microns to 8 microns of the quartz, leaving a finer surface roughening on the sample article as shown in FIG. 3.

Figure 3:
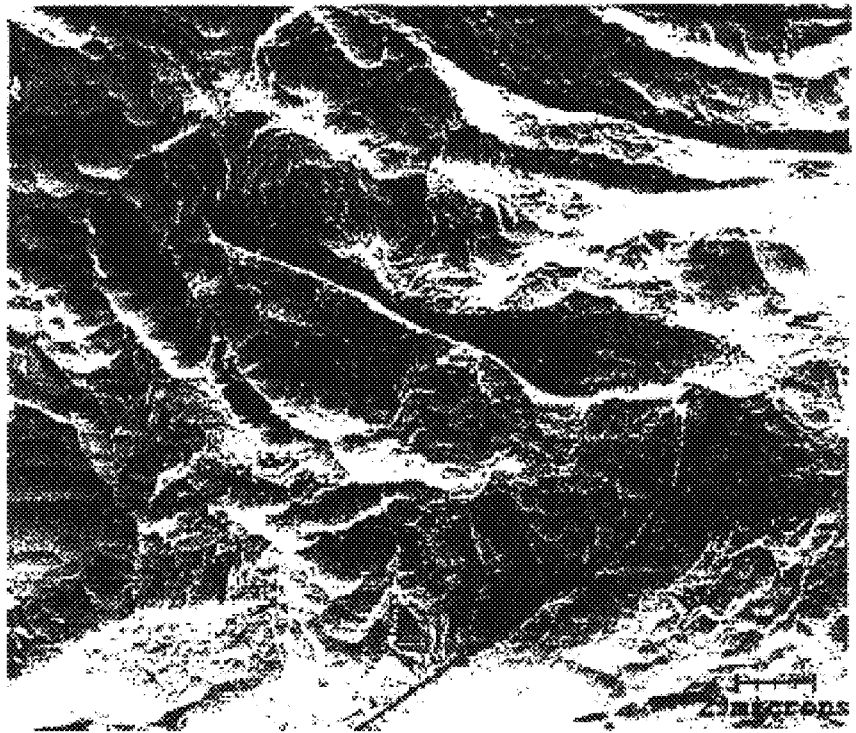
FIG. 3 is a microphotograph of the same quartz sample after sand blasting and chemical etching.

FIG. 2 and FIG. 3 show the quartz surface after mechanical roughening. FIG. 2 and FIG. 3 show significant surface topography variation which will both increase adhesion and reduce stress from CTE mismatch between the quartz and a deposited film. Adhesion and stress reduction is further improved by chemically etching the quartz to further increase its topography but on a finer scale as shown in FIG. 3. The chemical treatment roughens areas like fracture faces and unroughened surface areas that were not affected by the mechanically roughening. The combined roughening increases the amount of coatings that can be subsequently deposited on the quartz article before particle generation occurs and the article must be removed and cleaned.

While embodiments of the invention have been described, the present invention is capable of variation and modification and therefore should not be limited to the precise details of the examples. The invention includes changes and alterations that fall within the purview of the following claims.

What is claimed is:

1. A semiconductor processing article comprising a quartz body having a surface that has a surface-roughness comprising a first surface-roughness component and a second surface-roughness component; said first surface-roughness component being represented by a first average deviation from a first mean surface; said second surface-roughness component being represented by a second average deviation from a second mean surface and being superimposed on said first surface-roughness component; said first average deviation being from about 2.5 microns to about 50 microns, and said second average deviation being from about 0.25 micron to about 5 microns; said first mean surface being defined over a distance of about 500 microns along said surface, and said second mean surface being defined over a distance of about 50 microns along said surface; and said surface further having rounded trenches resulting from a chemical attack at cracks in said surface by a chemical etchant.

2. The article of claim 1, wherein said first average deviation from said first mean surface is in a range from about 5 to about 25 microns, and said second average deviation from said second mean surface is in a range from about 0.25 to about 5 microns.

3. The article of claim 1, wherein said first average deviation from said first mean surface is in a range from about 5 to about 25 microns, and said second average deviation from said second mean surface is in a range from about 0.5 to about 2.5 microns.

4. The article of claim 1, comprising a liner, process tube, shield, baffle, paddle, cantilever arm, carrier or boat.

5. The article of claim 1, comprising a cantilever arm, carrier or boat that is cycled into and out of a LPCVD furnace during processing of a semiconductor wafer.

6. A semiconductor furnace system comprising a quartz processing article that comprises a quartz body having a surface that has a surface-roughness comprising a first surface-roughness component and a second surface-roughness component; said first surface-roughness component being represented by a first average deviation from a first mean surface; said second surface-roughness component being represented by a second average deviation from a second mean surface and being superimposed on said first surface-roughness component; said first average deviation being from about 2.5 microns to about 50 microns, and said second average deviation being from about 0.25 micron to about 5 microns; said first mean surface being defined over a distance of about 500 microns along said surface, and said second mean surface being defined over a distance of about 50 microns along said surface; and said surface further having rounded trenches resulting from a chemical attack at cracks in said surface by a chemical etchant.

7. The furnace system of claim 6, wherein said first average deviation from said first mean surface is in a range from about 5 to about 25 microns, and said second average deviation from said second mean surface is in a range from about 0.25 to about 5 microns.

8. The furnace system of claim 6, wherein said first average deviation from said first mean surface is in a range from bout 5 to about 25 microns, and said second average deviation from said second mean surface is in a range from about 0.5 to about 2.5 microns.

9. The furnace system of claim 6, wherein said quartz processing article comprises a liner, process tube, paddle, carrier or boat.

10. The furnace system of claim 6, comprising a processing chamber to maintain a reduced pressure having at least one gas inlet to provide a reactive gas mixture therein and at least one exhaust outlet, a support comprising said quartz processing article positioned within said chamber and an article to be treated positioned on said support.

11. The furnace system of claim 10, wherein said article is a thin semiconductor substrate.

12. A semiconductor processing article comprising a quartz body having a surface that has a surface-roughness comprising a first surface-roughness component and a second surface-roughness component; said first surface-roughness component having a maximum first deviation from a first mean surface of about 5 to about 100 microns; said second surface-roughness component having a maximum second deviation from a second mean surface of about 0.5 to about 10 microns and being superimposed on said first surface-roughness component; said first mean surface being defined over a distance of about 500 microns along said surface, and said second mean surface being defined over a distance of about 50 microns along said surface; and said surface further having rounded trenches resulting from a chemical attack at cracks in said surface by a chemical etchant.

13. The semiconductor processing article of claim 12, wherein said maximum first deviation from said first mean surface is in a range from about 10 microns to about 50 microns.

14. The semiconductor processing article of claim 13, wherein said maximum second deviation from said second mean surface is in a range from about 1 micron to about 5 microns.

* * * * *